US008034546B2

(12) United States Patent
Robinson et al.

(10) Patent No.: US 8,034,546 B2
(45) Date of Patent: Oct. 11, 2011

(54) USE OF METHANOFULLERNE DERIVATIVES AS RESIST MATERIALS AND METHOD FOR FORMING A RESIST LAYER

(75) Inventors: Alex Robinson, Birmingham (GB); Jon Andrew Preece, Birmingham (GB); Richard Edward Palmer, Stourbridge (GB)

(73) Assignee: The University of Birmingham, Birmingham (GB)

( * ) Notice: Subject to any disclaimer, the term of this patent is extended or adjusted under 35 U.S.C. 154(b) by 1004 days.

(21) Appl. No.: 11/662,904

(22) PCT Filed: Sep. 19, 2005

(86) PCT No.: PCT/GB2005/003587

§ 371 (c)(1),
(2), (4) Date: Sep. 7, 2007

(87) PCT Pub. No.: WO2006/030234

PCT Pub. Date: Mar. 23, 2006

(65) Prior Publication Data

US 2008/0118874 A1    May 22, 2008

(30) Foreign Application Priority Data

Sep. 17, 2004    (GB) .................................. 0420702.3

(51) Int. Cl.
*G03F 7/16*    (2006.01)
*G03F 7/20*    (2006.01)
*G03F 7/30*    (2006.01)

(52) U.S. Cl. ...................... 430/325; 430/326; 430/270.1; 430/914; 430/921; 430/925

(58) Field of Classification Search ........................ None
See application file for complete search history.

(56) References Cited

U.S. PATENT DOCUMENTS

| 6,117,617 | A | 9/2000 | Kanayama et al. | |
| 2003/0129527 | A1* | 7/2003 | Kudo et al. | 430/270.1 |
| 2007/0190447 | A1* | 8/2007 | Ogata et al. | 430/270.1 |

FOREIGN PATENT DOCUMENTS

| EP | 0903637 | 3/1999 |
| JP | 92111862 | 8/1997 |
| JP | H11109613 | 4/1999 |
| JP | 11143074 | 5/1999 |
| JP | 11258796 | 9/1999 |
| WO | WO2005/081061 | 9/2005 |

OTHER PUBLICATIONS

Tada et al ("Multi-adduct derivatives of C60 for electron beam nano-resists", Microelectronic Engineering, 61-62 (2002), p. 737-743).*
Robinson et al. "*Systematic Studies of Fullerene Derivatives Electron Beam Resists,*" dated 2000, vol. 584, Materials Research Society, pp. 115-122.
Partial International Search Report dated Mar. 23, 2006 in regards to PCT application No. PCT/GB2005/003587.
Kanayama, T. et al., "Mechanism of Electron Irradiation Effect on Thin Films of Fullerene $C_{60}$ and its Derivatives;" Nat. Institue of Advanced Industrial Science and Tech., Japan, 4pp.
Robinson, A.P.G. et al., "Exposure mechanism of fullerene derivative electron beam resists;" Nanoscale Physics Research Lab., School of Phys. and Astronomy, University of Birmingham, UK, Oct. 29, 1999, pp. 469-474.
Hunt, M.R.C et al., "Electron-beam damage of $C_{60}$ films on hydrogen-passivated Si(100);" Nanoscale Physics Research Lab., School of Phys. and Astronomy, University of Birmingham, UK, Nov. 19, 1997, pp. 323-325.

* cited by examiner

*Primary Examiner* — Sin J. Lee
(74) *Attorney, Agent, or Firm* — Ohlandt, Greeley, Ruggiero & Perle, LLP

(57) ABSTRACT

The use as a resist material of a methanofullerene derivative having a plurality of open-ended addends, and to a method for forming a patterned resist layer on a substrate using the methanofullerene derivatives. The methanofullerene derivatives can be represented by the formal $C_{2x}(CR_1R_2)_m$ where x is at least 10, m is at least 2, each addend represented by $CR_1R_2$ is the same or different, and wherein each $R_1$ and $R_2$ is each a monovalent organic group, or a divalent organic group which forms a ring structure by being joined to the fullerene shell, or where both $R_1$ and $R_2$ of an addend are divalent groups, they may be mutually joined to form a ring structure, save that at least two of $R_1$ or two of $R_2$ are monovalent, or a mixture of such derivatives. The use of any methanofullerene derivative which has been chemically amplified for formation of a patterned resist layer. The essential step of the method is forming a coating layer comprising the methanofullerene derivative on the substrate surface, the methanofullerene derivative being chemically amplified by including in the coating layer at least one additional component which increases the sensitivity of the exposed layer to actinic radiation which is subsequently used to pattern the layer.

11 Claims, 3 Drawing Sheets

Figure 1:
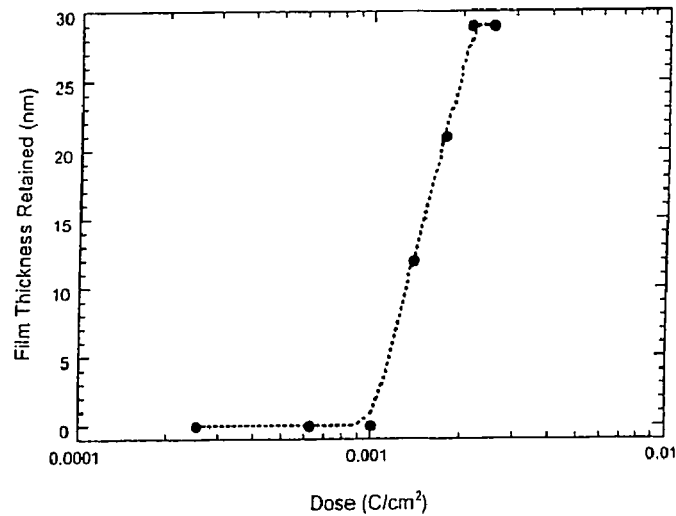

USE OF METHANOFULLERNE DERIVATIVES AS RESIST MATERIALS AND METHOD FOR FORMING A RESIST LAYER

The present invention relates to a resist material, particularly but not exclusively an electron beam resist material, and to a method for forming a finely patterned resist layer on a substrate surface using the resist material.

As is well known, the manufacturing process of various kinds of electronic or semiconductor devices such as ICs, LSIs and the like involves a fine patterning of a resist layer on the surface of a substrate material such as a semiconductor silicon wafer. This fine patterning process has traditionally been conducted by the photolithographic method in which the substrate surface is uniformly coated with a positive or negative tone photoresist composition to form a thin layer of the photoresist composition and selectively irradiating with actinic rays (such as ultraviolet light) through a photomask followed by a development treatment to selectively dissolve away the photoresist layer in the areas exposed or unexposed, respectively, to the actinic rays leaving a patterned resist layer on the substrate surface. The thus obtained patterned resist layer is utilized as a mask in the subsequent treatment on the substrate surface such as etching.

The fabrication of structures with dimensions of the order of nanometers is an area of considerable interest since it enables the realisation of electronic and optical devices which exploit novel phenomena such as quantum confinement effects and also allows greater component packing density. As a result, the resist layer is required to have an ever increasing fineness which can by accomplished only by using actinic rays having a shorter wavelength than the conventional ultraviolet light. Accordingly, it is now the case that, in place of the conventional ultraviolet light, electron beams (e-beams), excimer laser beams, EUV and X-rays are used as the short-wavelength actinic rays. Needless to say the minimum size obtainable is primarily determined by the performance of the resist material and the wavelength of the actinic rays.

Various materials have been proposed as suitable resist materials. These include organic resinous materials such as methacrylic resin-based, polystyrene-based and novolac resin based materials. In the case of negative tone resists based on polymer crosslinking, there is an inherent resolution limit of about 10 nm, which is the approximate radius of a single polymer molecule.

It is also known to apply a technique called "chemical amplification" to the polymeric resist materials. A chemically amplified resist material is generally a multi-component formulation in which there is a main polymeric component, such as a novolac resin which contributes towards properties such as resistance of the material to etching and its mechanical stability and one or more additional components which impart desired properties to the resist and a sensitiser. By definition, the chemical amplification occurs through a catalytic process involving the sensitiser which results in a single irradiation event causing exposure of multiple resist molecules. In a typical example the resist comprises a polymer and a photoacid generator (PAG) as sensitiser. The PAG releases a proton in the presence of radiation (light or e-beam). This proton then reacts with the polymer to cause it to lose a dissolution inhibiting functional group. In the process, a second proton is generated which can then react with a further molecule. The speed of the reaction can be controlled, for example, by heating the resist film to drive the reaction. After heating, the reacted polymer molecules are soluble in a developer whilst the unreacted polymer is not (i.e. positive tone resist). In this way the sensitivity of the material to actinic radiation is greatly increased, as small numbers of irradiation events give rise to a large number of exposure events.

In other chemical amplification schemes, irradiation results in cross-linking of the exposed resist material; thereby creating a negative tone resist. The polymeric resist material may be self cross-linking or a cross linking molecule may be included. Chemical amplification of polymeric-based resists is disclosed in U.S. Pat. Nos. 5,968,712, 5,529,885, 5,981,139 and 6,607,870 (the disclosures of which are incorporated by reference).

Other materials have been investigated as potential resist materials, including low molecular weight organic molecules (Yoshiiwa M, et. al., Appl. Phys. Lett. 69 (1996) 2605) and inorganic substances such as metal fluorides (Fujita J, et. al., Appl. Phys. Lett. 66 (1995) 3064). $C_{60}$ (fullerene) demonstrates negative tone behaviour, but has low sensitivity (critical dose about $1 \times 10^{-2}$ $C/cm^2$). Various methanofullerene derivatives were subsequently shown to be useful e-beam resist materials by the present inventors, Appl. Phys. Lett. volume 72, page 1302 (1998), Appl. Phys. Lett. volume 312, page 469 (1999), Mat. Res. Soc. Symp. Proc. volume 546, pace 219 (1999) and U.S. Pat. No. 6,117,617. Most of these prior art materials had a single methano-bridge, the compounds generally being referred to as mono-adducts of fullerene ($C_{60}$). The mono-adducts can be further subdivided into two groups: the open-ended addend group in which the addend forms a tail extending away from the fullerene cage (the tail may consist of a pair of addend side chains extending away from the methano-bridge (e.g. MAF 4, 5 or 7), or a macrocycle beginning and ending at the methano-bridge (e.g. MAF 3) and the closed addend group in which the two side chains of the addend loop back to the fullerene cage and form macrocycles therewith (e.g. TrAF). The only example of a multi-addend fullerene was TeAF, in which there was a single closed addend and a single open ended addend.

MAF3

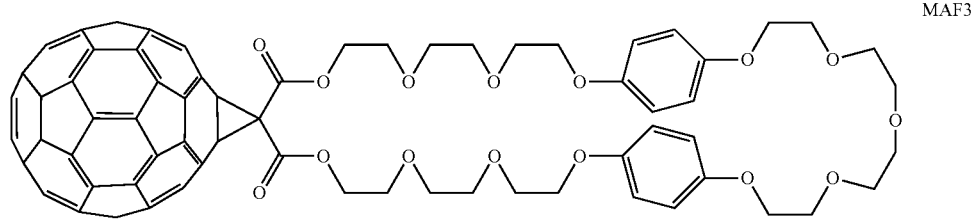

-continued
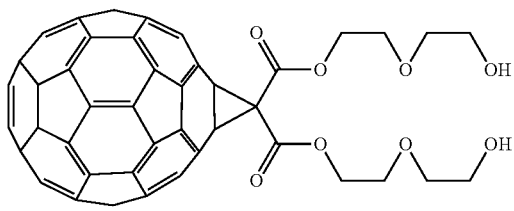
MAF4
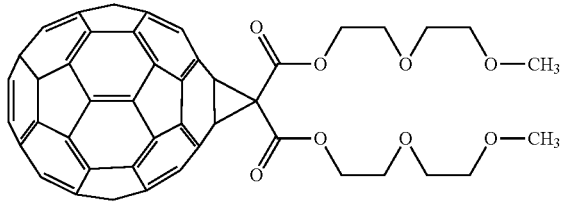
MAF5
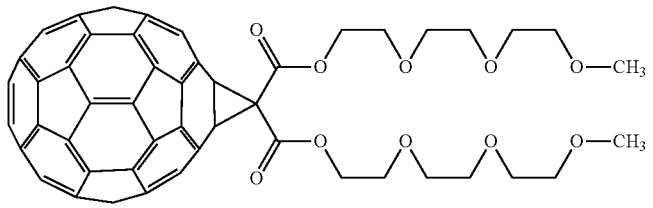
MAF7
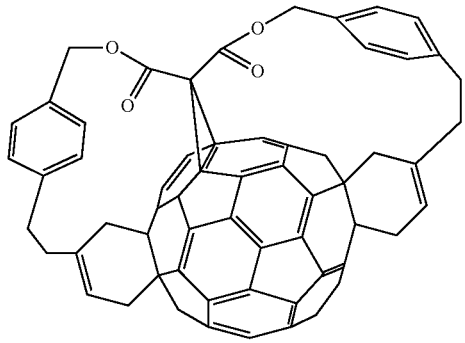
TrAF
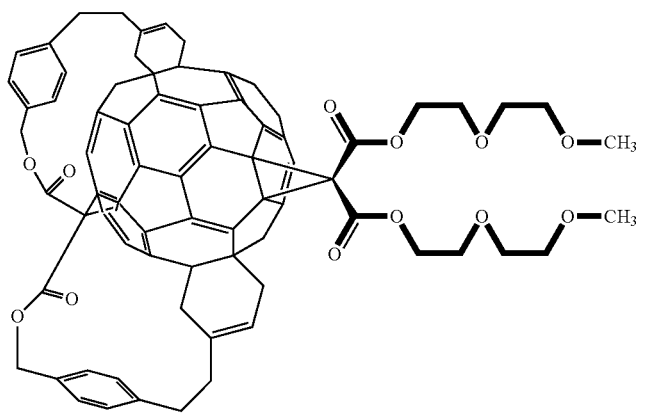
TeAF It will be understood that, due to the nature of the resist materials, the standard technique for forming a uniform film of the resist material on a substrate is by dissolution in a solvent and spin coating. Mention has already been made of the use of a developer to remove exposed (or unexposed) resist material after irradiation. Typical solvents used for these purposes are organic (e.g. esters, acetates, glycol ethers, xylene) and often halogenated (e.g. chloroform, monochlorobenzene). Such solvents are unsatisfactory for cost, health and/or environmental considerations and there is a need to find safer alternatives.

It is an object of the present invention in one aspect to provide a novel photoresist material which obviates or mitigates one or more disadvantages associated with prior art resist materials.

According to a first aspect, the present invention resides in the use as a resist material of a methanofullerene derivative having a plurality of open-ended addends.

It will be understood that said methanofullerene derivatives comprise at least two methano-bridge atoms, and can be conveniently represented by the formula $C_{2x}(CR_1R_2)_m$ where x is at least 10 (preferably 17), m is at least 2, and preferably no more than 10, each addend represented by $CR_1R_2$ may be the same or different, and wherein each $R_1$ and $R_2$ may each be a monovalent organic group or a divalent organic group which forms a ring structure by being joined to the fullerene shell, or where both $R_1$ and $R_2$ of an addend are divalent groups, they may be mutually joined to form a ring structure, save that at least two of $R_1$ or two of $R_2$ are monovalent, i.e. there are at least two open ended addends.

For the avoidance of doubt, the scope of the present invention extends to fullerenes having any number of carbon-cage atoms (the theoretical minimum being 20). $C_{60}$, being the smallest stable fullerene, is preferred, although derivatives based on other fullerenes (e.g. $C_{50}$ or $C_{70}$) may prove acceptable as resist materials.

The resist material may comprise a mixture of such methanofullerenes. In particular the resist material may comprise a mixture of compounds which have the same addends but differ only in the number of addends per molecule (i.e. different m).

Preferably, for each addend, $R_1$ and $R_2$ are the same, more preferably $R_1$ and $R_2$ are the same for all addends. Preferably, at least one of $R_1$ and $R_2$ contains oxygen and more preferably a plurality of oxygen molecules. In a particularly preferred embodiment, at least one of $R_1$ and $R_2$ contains a polyether moiety.

Especially preferred are methanofullerenes having one or more addends satisfying the formula:

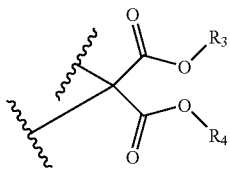

in which $R_3$ and $R_4$ are independently selected from $-[(CH_2)_nO_q]_p-R_5$ in which n is preferably from 1 to 8 (most preferably 2), p is preferably 1 to 5 (most preferably 2 or 3), q is 0 or 1 and in which $R_5$ is preferably hydrogen, hydroxy, straight or branched alkyl (e.g. methyl or t-butyl), cycloalkyl (e.g. cyclohexyl), a heterocycle (e.g. an oxygen containing heterocycle such as tetrahydrofuranyl, tetrahydropyranyl), or a substituted or unsubstituted aromatic moiety (e.g. phenyl, naphthylen-yl, triphenylen-yl), said substituent(s) preferably being alkoxy).

In alternative embodiments, $R_3$ and $R_4$ may be linked via a bridging moiety, such as an ether moiety.

Specific examples of useful addends are:

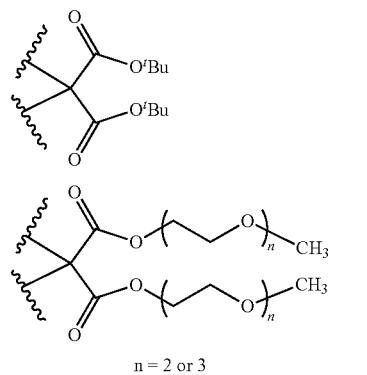

n = 2 or 3

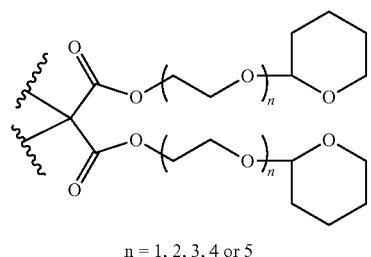

n = 1, 2, 3, 4 or 5

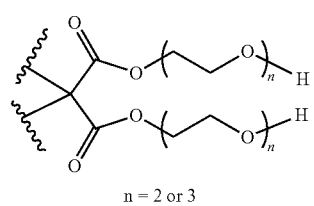

n = 2 or 3

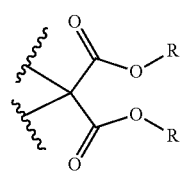

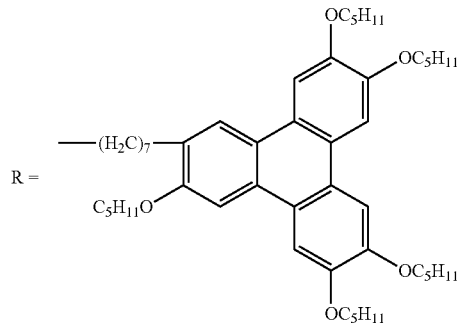

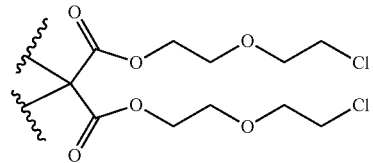

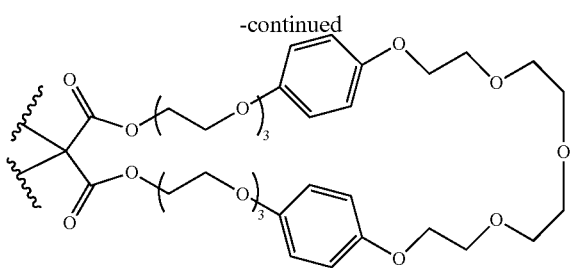

According to a second aspect of the invention there is provided a method for the formation of a patterned resist layer on a substrate surface by patternwise irradiation with actinic radiation comprising the steps of:
(i) forming a coating layer comprising a methanofullerene in accordance with the first aspect on the substrate surface,
(ii) irradiating the coating layer patternwise, and
(iii) removing unirradiated areas of the coating layer.

Step (i) may be achieved by application of the methanofullerene in solution, followed by removal of the solvent. Solvent may be removed by heating, a process which is commonly referred to as a soft pre-bake. Convenient coating techniques include spin coating (preferred) dipping and roller coating. Other conventional coating techniques include vacuum sublimation. When spin coating, it will be appreciated that the solids content of the coating solution can be adjusted to provide a desired film thickness based upon the specific spinning equipment utilized, and parameters such as the viscosity of the solution, the speed of the spinner and the amount of time allowed for spinning. The film thickness is not particularly limited and may be 10 nm or less to several hundred (e.g. 500) nanometers The nature of the substrate is not particularly limited, but in the preparation of electronic components, the substrate will normally be a silicon or silicon dioxide wafer for the production of microprocessors and other integrated circuit components. Aluminum-aluminum oxide, gallium arsenide and silicon nitride wafers can also serve as substrate.

Solvents which may be used in step (i) include chloroform, chlorobenzene, dichlorobenzene, anisole, ethyl-3-ethoxy propionate and acetone. Preferably the concentration of methanofullerene derivative is from about 1 to 10 mg/ml.

The solvent in step (i) is preferably anisole, ethyl-3-ethoxy propionate or acetone.

Step (iii) is conveniently achieved by selectively dissolving the unirradiated areas of the coating layer in a second solvent (e.g. by immersion or spraying). Solvents which may be used in step (iii) include chloroform, chlorobenzene, dichlorobenzene, anisole, ethyl-3-ethoxy propionate, acetone, isopropyl alcohol:water.

Preferably, the solvent used in step (iii) is selected from anisole, 3-ethoxy propionate, isopropyl alcohol/water in a ratio of at least 1:1, preferably 7:3 and chlorobenzene/isopropyl alcohol, especially chlorobenzene/isopropyl alcohol in a ratio of 1:2 (increasing the ratio of isopropanol reduces the strength of the developer which in turn increases sensitivity at the cost of resolution.

Step (ii) is preferably conducted using electron beam energy although excimer laser beams and X-rays may also be used. The patternwise irradiation may be achieved by scanning the actinic ray source according to the required pattern, or by using a mask formed to the pattern over the substrate.

The method may include the additional step, between steps (ii) and (iii) of a post exposure bake, in which the substrate is heated to an elevated temperature (e.g. 50 to 150° C., preferably about 100° C.), for a predetermined period (e.g. 0.1 to 20 minutes, preferably about 1-2 minutes).

Preferably, the methanofullerene is chemically amplified. That is, the coating layer formed in step (i) includes at least one additional component (sensitiser) which increases the sensitivity of the exposed layer to the actinic radiation of step (ii). It will be appreciated that when the coating layer is formed from solution, the additional component(s) are also in solution. In a preferred embodiment, the additional components are a photo acid generator and optionally a cross-linker.

Suitable PAGs are described in U.S. Pat. No. 6,607,870 (incorporated herein by reference) and include non-ionic, organic acid generators. Specific non-ionic organic acid generators include halogenated non-ionic compounds such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclododecane; 1,10-dibromodecane; 1,1-bis[p-chlorophenyl]2,2-dichloroethane; 4,4'-dichloro-2-(trichloromethyl)benzhydrol or 1,1-bis (chlorophenyl)2-2,2-trichloroethanol; hexachlorodimethylsulfone; 2-chloro-6-(trichloromethyl) pyridine; O,O-diethyl-O-(3,5,6-trichloro-2-pyridyl) phosphorothioate; 1,2,3,4,5,6-hexachlorocyclohexane; N(1,1-bis [p-chlorophenyl]-2,2,2-trichloroethylacetamide; tris[2,3-dibromopropyl]isocyanurate; 2,2-bis[p-chlorophenyl]-1,1-dichloroethylene. Suitable photoacid generators are also disclosed in European Patent Application Nos. 0164248 and 0232972. Especially preferred is triphenylsulphonium triflate. In addition to PAGs it is possible to use photoinitiators such as triarylsulfonium hexafluoroantiminate salts or triarylsulfonium hexafluorophosphate salts.

Amine-based crosslinkers are preferred. Suitable amine-containing crosslinkers include urea-formaldehyde, melamine-formaldehyde, benzoguanamine-formaldehyde, glycoluril-formaldehyde resins and combinations thereof. Other suitable amine-based crosslinkers include the melamines manufactured by American Cyanamid Company such as Cymel™ 300, 301, 303, 350, 370, 380, 1116 and 1130; benzoguanamine resins such as Cymel™ 1123 and 1125; glycoluril resins Cymel™ 1170, 1171, 1172; and urea-based resins Beetle™ 60, 65 and 80. A large number of similar amine-based compounds are presently commercially available from various suppliers. As known to those in the art, polymeric amine-based resins may be prepared by the reaction of acrylamide or methacrylamide copolymers with formaldehyde in an alcohol-containing solution, or alternatively by the copolymerization of N-alkoxymethyl acrylamide or methacrylamide with other suitable monomers. In addition to amine-based crosslinkers, epoxide crosslinkers may also be used, such as epoxy novolacs (e.g. DEN439 sold by Dow Chemicals).

Of the above crosslinkers, the melamines are preferred, and particularly preferred are hexaalkoxymethylmelamines such as the above identified Cymel™ resins, especially Cymel™ 300.

A preferred mass ratio of methanofullerene to sensitiser is from about 1:0.1 to 1:1. A preferred ratio of methanofullerene by mass to cross linker by weight is from about 1:0.1 to 1:3.

The methanofullerene derivative used in the method may be one in accordance with the first aspect. However, the inventors have surprisingly discovered that excellent results are also obtained in the method when chemical amplification is applied to the prior art methanofullerenes. Thus, the second aspect includes within its scope the use in step (i) of any methanofullerene whether or not a mono-adduct fullerene and whether or not the addend or addends are open or closed as described above when chemically amplified. Addends of particular interest are those of formula:

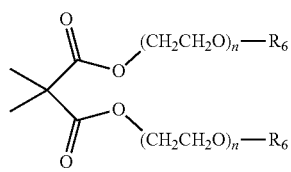

where n is 1 to 5 and $R_6$ is linear or branched $C_{1-4}$ alkyl.

Subsequent to step (iv), the developed substrate may be selectively processed on those substrate areas bared of the coating composition, for example by chemically etching or plating using procedures well known in the art. For the manufacture of microelectronic substrates, for example the manufacture of silicon dioxide wafers, suitable etchants include a plasma gas etch and a hydrofluoric acid etching solution. After such processing, the resist layer may be removed from the processed substrate using known stripping procedures. The historical background, types and processing of conventional photoresists are described by DeForest, Photoresist Materials and Processes, McGraw Hill Book Company, New York, ch. 2, 1975, and by Moreau, Semiconductor Lithography, Principles, Practices and Materials, Plenum Press, New York, ch. 2 and 4, 1988, both incorporated herein for their teaching of photoresist compositions and methods of making and using the same.

The invention further resides in a substrate treated in accordance with the process of the second aspect.

Figure 2:
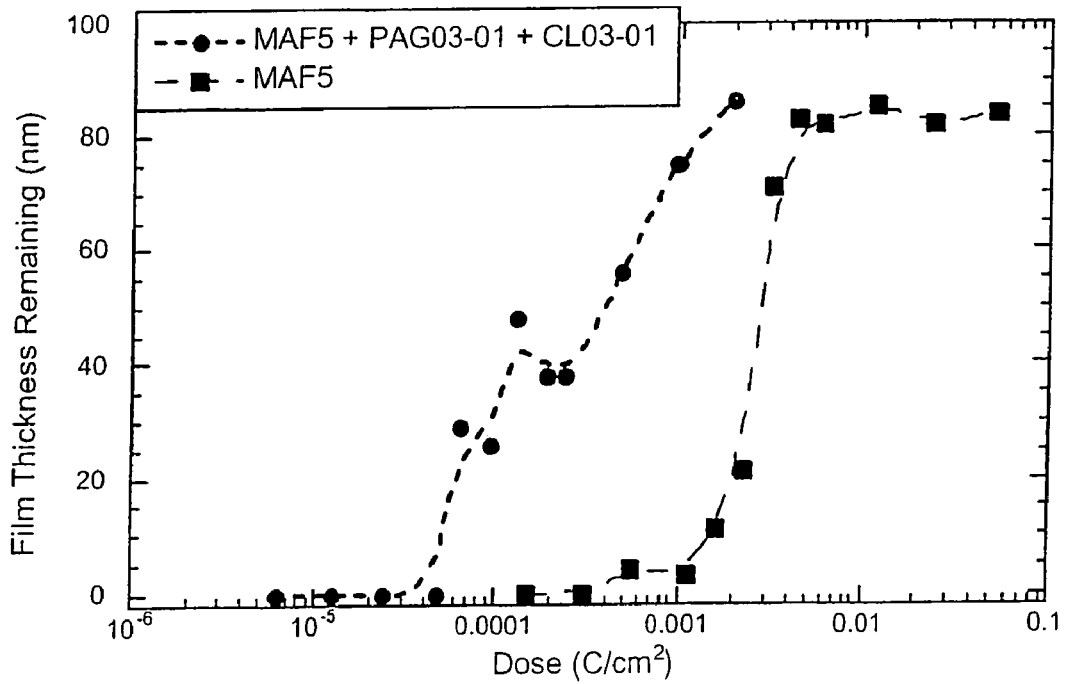
Figure 3:
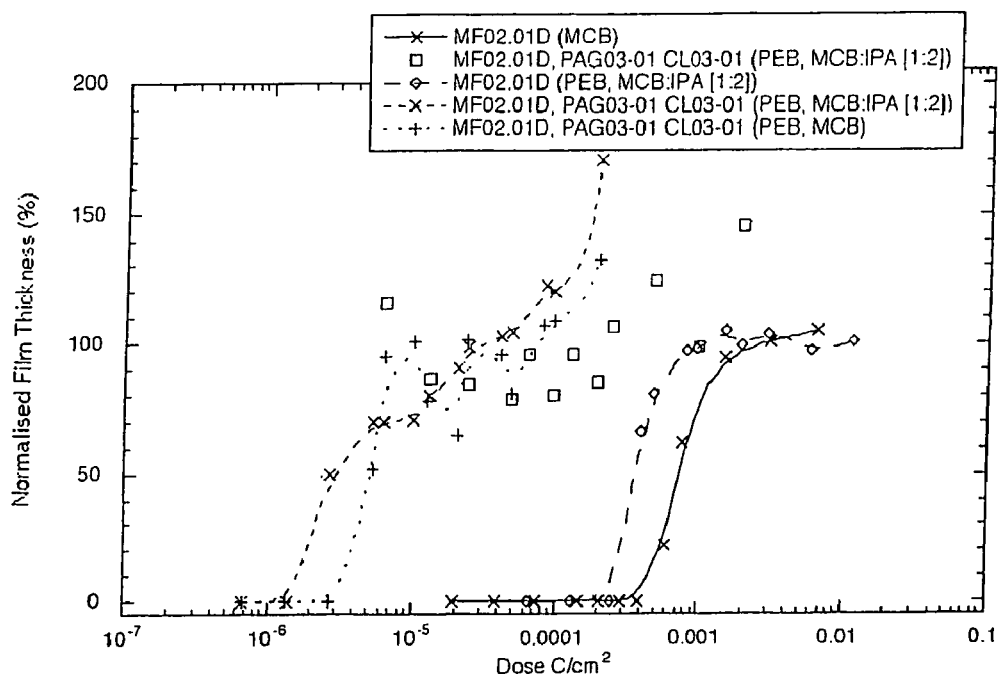
Figure 4:
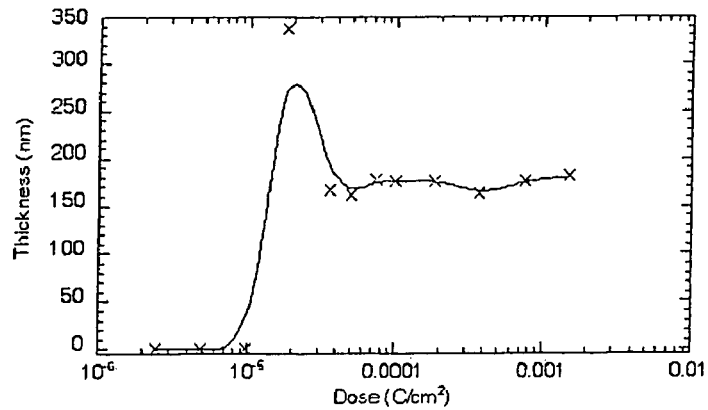
Figure 5:
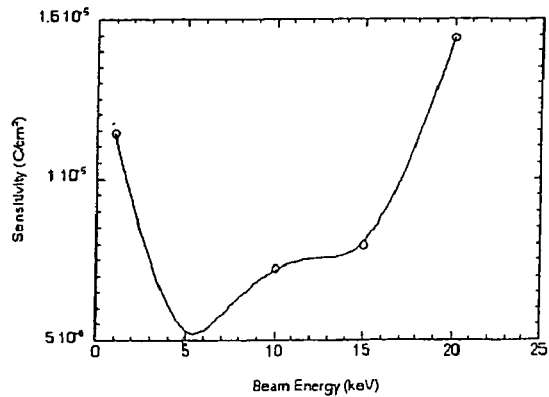
Figure 6:
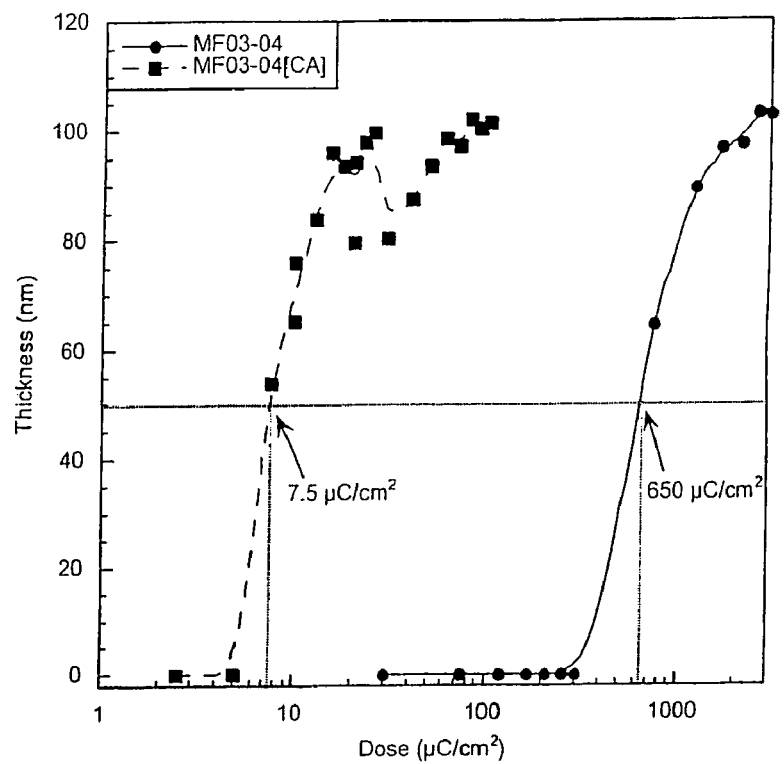
Figure 7:
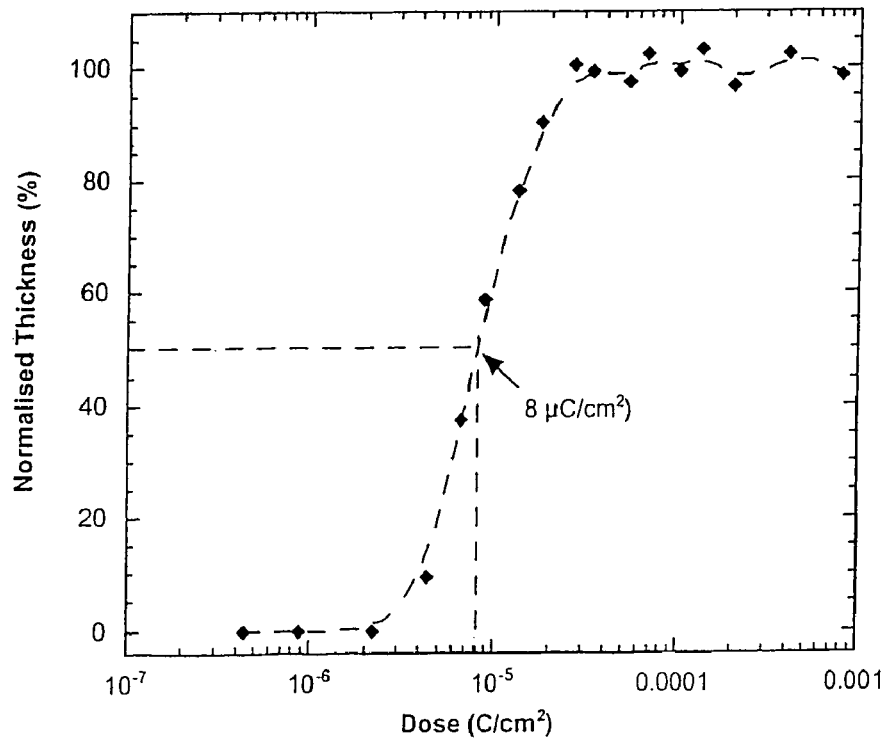

Embodiments of the invention will now be described by way of example with reference to the accompanying drawings in which FIG. 1 is a plot of retained film thickness against exposure dose for a MF03-01 film after irradiation with 20 KeV electrons and development in anisole, FIG. 2 is a plot of retained film thickness against exposure dose for a pure and a chemically amplified MAF5 film after irradiation with 20 KeV electrons and development in chlorobenzene, FIG. 3 is a plot of film thickness (normalised) against exposure dose for pure and chemically amplified MF02-01D films after irradiation with 20 KeV electrons and development in different solvents, FIG. 4 is a plot of film thickness against exposure dose for a chemically amplified MF03-01 film after irradiation with 20 KeV electrons and development in chlorobenzene, FIG. 5 is a plot of sensitivity against beam energy for a chemically amplified MF03-01 film, FIG. 6 is a plot of film thickness against exposure dose for pure and chemically amplified MF03-04 films after irradiation with 20 KeV electrons and development in chlorobenzene, and FIG. 7 is a plot of film thickness against exposure dose for a different chemically amplified MF03-04 film after irradiation with 20 KeV electrons and development in anisole.

In the following examples, reference is made to the following methanofullerenes which are listed below for convenience. Where in the text a compound is referenced as [CA], it is the chemically amplified version of the corresponding methanofullerene shown below:

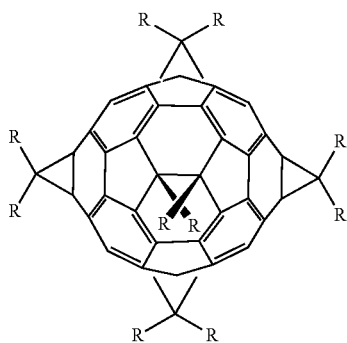

MF02-01

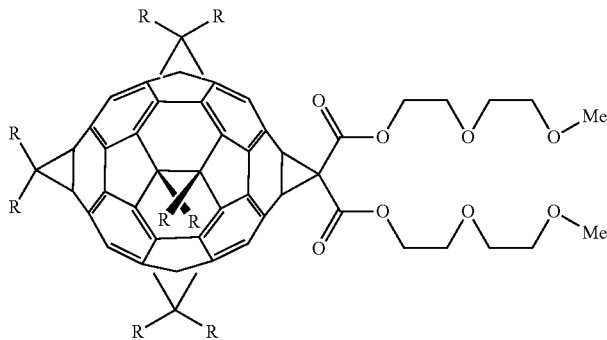

MF03-01

-continued

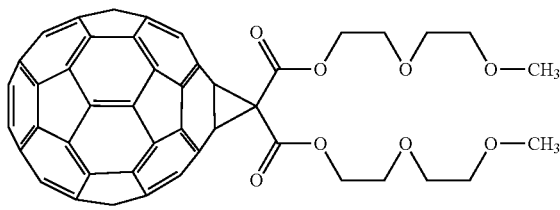
MAF5

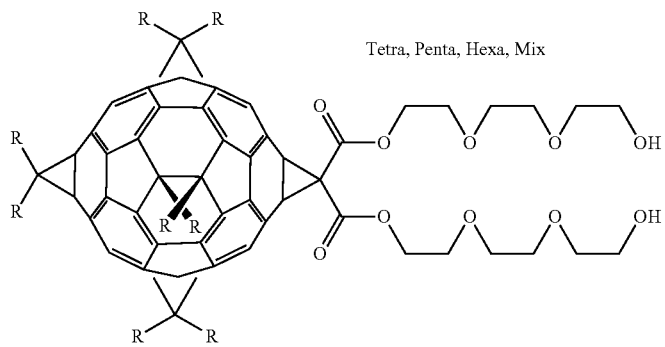
Tetra, Penta, Hexa, Mix
MF03-04

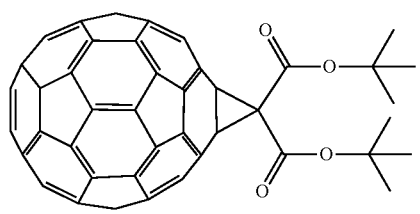
D97.2 (9)

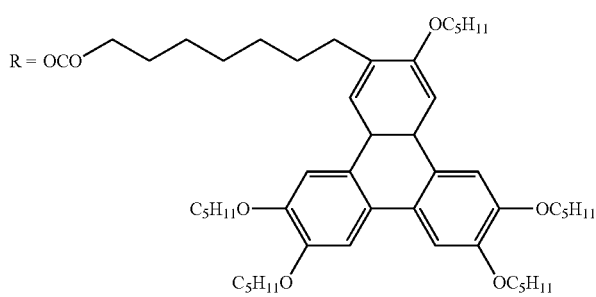

Compound Preparations

Unless stated otherwise, compounds were prepared in accordance with the methods disclosed in "Fullerene Derivatives as Novel Resist Materials for Fabrication of MEMS devices by Electron Beam Lithography", A.P.G. Robinson et. al., MRS Symposium Proceedings, v546, eds. A.H. Heuer and with or without chemical amplification. Preliminary data suggests that acetone can also be used. S. J. Jacobs, (Materials Research Society, Pennsylvania, USA, 1999), pp 219-224, "Covalent Fullerene Chemistry" Francois Diederich and Carlo Thilgen, Science, vol 271, pp 317-323, 19 Jan. 1996, "Structures and Chemistry of Methanofullerenes: A Versatile Route into N-[(Methanofullerene)carbonyl]-substituted amino acids", Lyle Isaacs and Francois Diederich, Helvetica Chimica Acta, vol 76 p 2454-2464 (1993), or "Syntheses, structures, and properties of Methanofullerenes", F. Diederich, L. Isaacs and Douglas Philp, Chemical Society Reviews, 1994 pp 243-255.

Compound (MF02-01)

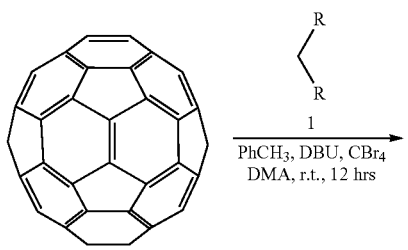

-continued

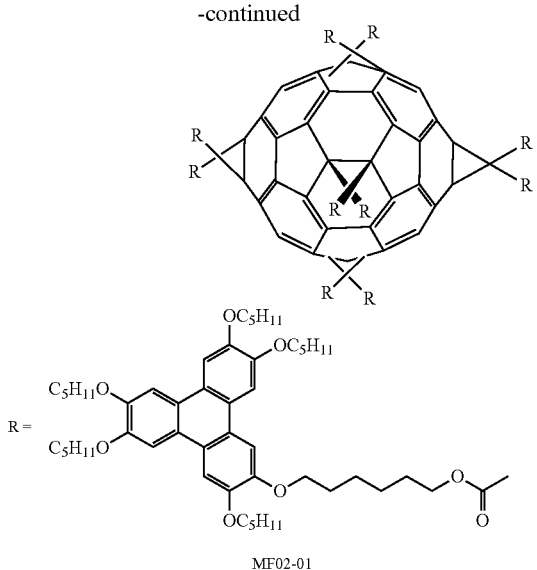

MF02-01

A solution of C$_{60}$ (50 mg, 0.07 mmol) and 9,10-dimethylanthracene (DMA) (143 mg, 0.69 mmol) in toluene (100 ml) was stirred at room temperature for 2 h. Then, CBr$_4$ (230 mg, 0.694 mmol) and malonic acid bis[7-(3,6,7,10, 11-pentakispentyloxytriphenylene-2-yloxy)hexyl]ester 1 (1.12 g, 0.65 mmol) were added and 1,8-diazobicyclo(5.4.0)undec-7-ene (DBU) (211 µl, 1.34 mmol) was added dropwise. The reaction mixture was stirred for 24 h and then filtered through a silica gel plug in a sintered glass filter funnel, eluting initially with toluene to remove excess C$_{60}$ and then eluting the products with CH$_2$Cl$_2$/MeOH (20/1). The second fraction was concentrated in vacuo yielding a dark brown solid, which was further purified by silica gel column chromatography (hexane/CH$_2$Cl$_2$, 1:1) to yield a mixture of (MF02-01) as a brown solid (500 mg, 69%). m/z (FABMS): 10418 (M+)+ hexa, 8800 (M+)+ penta, 7183 (M+)+ tetra, 5566 (M+)+ tri adducts. These results were recorded three weeks post reaction.

Compound (MF03-01)

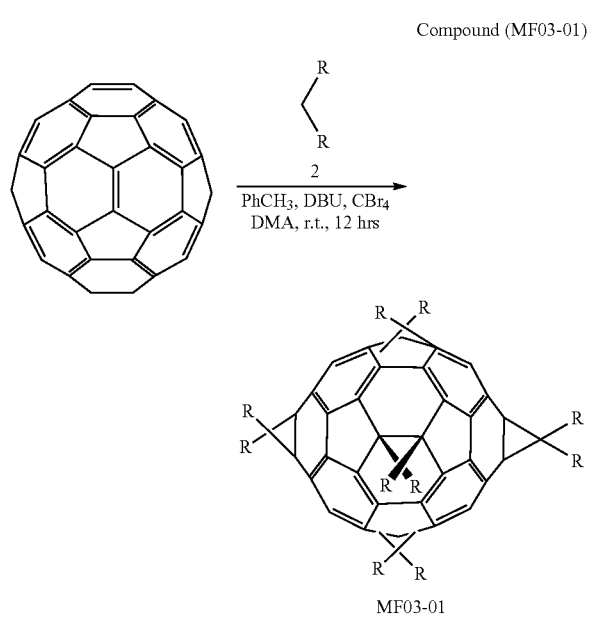

MF03-01
R = OCOCH$_2$CH$_2$OCH$_2$CH$_2$OMe

A solution of C$_{60}$ (100 mg, 0.13 mmol) and 9,10-dimethylanthracene (DMA) (286 mg, 1.38 mmol) in toluene (100 ml) was stirred at room temperature for 2 h. Then, CBr$_4$ (461 mg, 1.38 mmol) and bis malonate dimethyl ether 2 (428 mg, 1.38 mmol) were added and 1,8-diazobicyclo(5.4.0)undec-7-ene (DBU) (422 mg, 2.8 mmol) was added drop wise. The reaction mixture was stirred for 24 h and then filtered through a silica gel plug in a sintered glass filter funnel, eluting initially with toluene to remove the excess C$_{60}$ and then eluting the products with CH$_2$Cl$_2$/MeOH (20/1). The second fraction was concentrated in vacuo yielding a dark brown solid, which was further purified by silica gel column chromatography (hexane/CH$_2$Cl$_2$, 1:1) to yielded a mixture of (MF03-01) as a brown solid (78 mg). m/z (FABMS): 2580 [M+Na]$^+$ hexa, 2274 [M+Na]$^+$ penta, 1968 [M+Na]$^+$ tetra, 1662 [M+Na]$^+$ tri adducts. These results were also recorded three weeks post reaction.

Compound (MAF5)

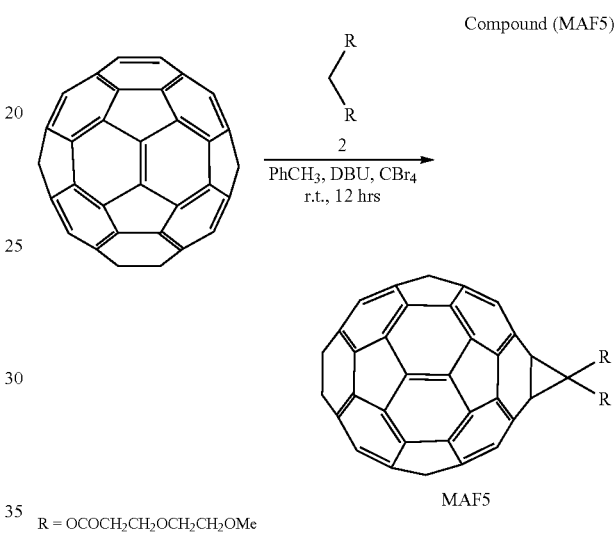

MAF5
R = OCOCH$_2$CH$_2$OCH$_2$CH$_2$OMe

A solution of 1,8-diazobicyclo(5.4.0)undec-7-ene (63.3 mg, 0.41 mmol) in dry degassed PhMe (25 ml) was added dropwise to a stirred, ice-cold solution of C$_{60}$ (100 mg, 0.13 mmol), CBr$_4$ (69 mg, 0.20 mmol) and bis malonate dimethyl ether 2 (64 mg, 0.20 mmol) in dry, N$_2$ degassed PhMe (100 ml) in a round-bottomed flask covered with aluminium foil under a N$_2$ atmosphere. The reaction was stirred overnight allowing it to warm to room temperature followed by plug filtration (silica gel) washing first with PhMe to remove excess C$_{60}$ and secondly with a mixture of CH$_2$Cl$_2$/EtOAc to elute the product. The second fraction was concentrated in vacuo and the residue was purified by column chromatography (CH$_2$Cl$_2$/EtOAc) affording compound (MAF5) as a dark brown solid (67 mg, 47%). m/z (FABMS): 1049 [M+Na]$^+$; 13C NMR (75 MHz, CDCl$_3$): 163.4, 145.2, 145.1, 145.0, 144.7, 144.6, 144.0, 143.1, 143.1, 143.0, 142.2, 142.0, 141.0, 139.0, 72.0, 71.4, 70.6, 68.8, 66.2, 59.0, 30.3, 29.7.

Compound (MF03-04)

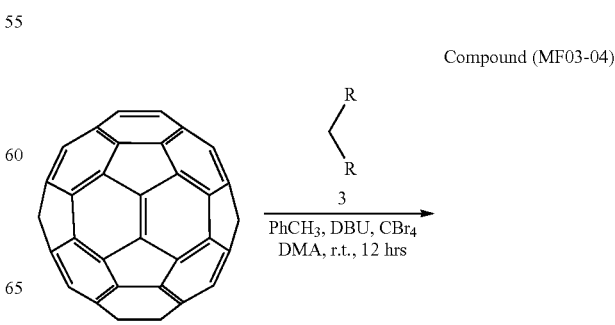

-continued

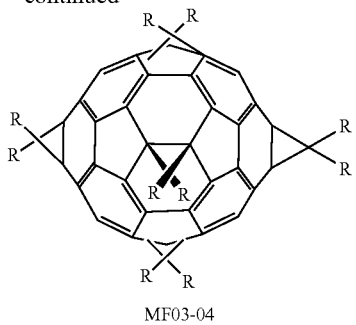

MF03-04

R = OCOCH$_2$CH$_2$OCH$_2$CH$_2$OCH$_2$CH$_2$OH

A solution of C$_{60}$ (100 mg, 0.13 mmol) and 9,10-dimethylanthracene (DMA) (286 mg, 1.39 mmol) in toluene (100 ml) was stirred at room temperature for 2 h. Then, CBr$_4$ (461 mg, 1.39 mmol) and bis malonate ester 3 (511 mg, 1.39 mmol) were added and 1,8-diazobicyclo(5.4.0)undec-7-ene (DBU) (422 mg, 2.8 mmol) was added dropwise. The reaction mixture was stirred for 24 h and then filtered through a silica gel plug in a sintered glass filter funnel, eluting initially with toluene to remove excess C$_{60}$ and then eluting the products with CH$_2$Cl$_2$/MeOH (20/1). The second fraction was concentrated in vacuo yielding a dark brown solid, which was further purified by silica gel column chromatography (hexane/CH$_2$Cl$_2$, 1:1) to yield a mixture of (MF03-04) as a brown solid (78 mg). m/z (FABMS): 2575 [M+Na]$^+$ penta, 2250 [M+Na]$^+$ tetra, 1842 [M+Na]$^+$ tri adducts. These results were also recorded three weeks post reaction.

EXAMPLE 1

Forming Films of a Fullerene Resist Using a Safe Casting Solvent

A solution of the multi-addend MF03-01 was prepared using the safe solvent anisole. 7.7 mg of the derivative was dissolved in 400 μl of the solvent. 50 μl of this solution was deposited on a square 4 cm$^2$ hydrogen terminated silicon substrate, which was then spun at 1000 RPM for 120 seconds, followed by 3000 RPM for 10 seconds. A smooth film with thickness 30 nm was created on the substrate.

A further solution consisting of 2.7 mg of MF03-01, 0.85 mg of the crosslinker TMOM-BP (Honshu Chemicals) and 0.29 mg of the photoacid generator triphenylsulphonium triflate in 180 μl of anisole was used to prepare a chemically amplified film of fullerene derivative based resist on hydrogen terminated silicon (estimated thickness 50 mm), using the same conditions as mentioned above (with the exception that the first spin speed was held for 60 seconds instead of 120).

Additionally the compound MF02-01 has been successfully spin coated from both anisole and ethyl-3-ethoxy propionate, which is also considered to be a safe solvent. So far it has been found that anisole or ethyl-3-ethoxy propionate can be substituted for the previously used chloroform for methanofullerenes used with or without chemical amplification. Preliminary data suggests that acetone can also be used.

EXAMPLE 2

Developing Films of a Fullerene Resist Using a Safe Developer

Previously, chlorobenzene (MCB) has been used as a developer for the fullerene resists. The inventors have now found that three safer alternatives exist. For instance a film of MF03-01 was prepared using an anisole casting solvent as described in example 1. The film was exposed using 20 keV electrons in a scanning electron microscope (SEM). After exposure, the film was dipped in a beaker of anisole for 10 seconds and then rinsed with isopropyl alcohol and dried with nitrogen gas. It was observed that the unexposed areas of the film were fully removed, whilst the material was retained in the exposed areas. (For reference, isopropyl alcohol does not remove either area). FIG. 1 shows a graph of the remaining film thickness versus the exposure dose of electrons for a film of MF03-01 after development in anisole.

The same process was used successfully to develop chemically amplified films of MF03-01 and MAF5, and both pure and chemically amplified films of MF03-04. In all cases anisole was a suitable developer. Similar results were seen when using ethyl-3-ethoxy propionate and a mixture of isopropyl alcohol with pure water (in a ratio of 7:3). Isopropyl alcohol on its own did not develop the material in any of the cases and was therefore used in each case to rinse the developer off the samples.

EXAMPLE 3

Response to Electron Irradiation of Chemical Amplified Mono-Addend Fullerene Derivative MAF5

The known derivative MAF5 has a sensitivity of approximately 2500 μC/cm$^2$ as a pure electron beam resist (all sensitivities quoted are at an expose beam energy of 20 keV unless stated otherwise). The photoacid generator triphenylsulphonium triflate (abbreviated hereinafter as PAG03-01) and the crosslinker hexamethoxymethylmelamine (hereinafter referred to as CL03-01, and known by the trade name Cymel 300) were combined with the MAF5 in the ratio 1 mg MAF5:0.13 mg PAG03-01:1.67 μl CL03-01, and the mixture was dissolved in the solvent chloroform, to give a solution with a strength of 10 mg/ml of MAF5. 100 μl of the solution was deposited on a hydrogen terminated silicon substrate of 4 cm$^2$ area, and the substrate was spun at 600 rpm for 60 seconds, by which time a smooth film had formed (thickness 80 nm). The incorporation of the photoacid generator and the crosslinker led to an increase in the sensitivity of the resist as shown in FIG. 2. The MAF5[CA] based resist was given a post exposure bake (PEB) of 103° C. for 120 seconds, before development in the same solvent as MAF5 (chlorobenzene in this case). It can be seen from FIG. 2 that the sensitivity of the resist has been increased from 2500 μC/cm$^2$ to approximately 200 μC/cm$^2$, representing an increase in sensitivity of around one order of magnitude.

1.6 mg of the derivative D97.2 was dissolved using 100 μl of chloroform. 50 μl of this solution was used to prepare a non chemically amplified film of the derivative, on hydrogen terminated silicon of size 4 cm$^2$, using spin coating with a speed of 500 RPM for 60 seconds followed by 3000 RPM for 10 seconds. The film was exposed using electrons, and developed in MCB, rinsed in IPA and dried with nitrogen gas. The measured sensitivity of the film was found to be 7500 μC/cm$^2$. The remaining solution was then taken and mixed with PAG03-01 and CL03-01, to give a chemically amplified film with the ratio of components, 1 mg D97.2:0.2 mg PAG03-01: 1.5 μl CL03-01. A film of the D97.2[CA] composition was prepared in exactly the same way as the D97.2 film. D97.2

[CA] showed an increase in sensitivity of almost two orders of magnitude to around 20 µC/cm².

EXAMPLE 4

Response to Electron Irradiation of MF02-01 and MF02-01[CA]

MF02-01 is a multiple addend derivative of $C_{60}$ prepared as a mixture of tetra, penta and hexa addend derivatives. Various different ratios of the three different adducts have been prepared. MF02-01A is mainly hexa-adduct whilst MF02-01D is approximately an equal mixture of the three derivatives. In terms of resist formation, the results for MF02-01A and MF02-01D are similar, with only minor differences in the exact sensitivities. Results for MF02-01D are presented below.

Films of pure MF02-01D and MF02-01D[CA] were prepared. The chemically amplified film incorporated PAG03-01 and CL03-01 in a ratio of 1 mg MF02-01D:0.28 mg PAG03-01:3.125 µl CL03-01. A solution of this mixture, with a concentration of 10.6 mg/ml of MF02-01D in chloroform was prepared. Films were formed on hydrogen terminated silicon substrate by spin coating as described above (thickness 100 nm). Shown in FIG. 3 is a graph of the response to irradiation of several different films of the chemically amplified and non amplified films for two different developers (monochlorobenzene and monochlorobenzene/isopropanol 1:2).

It can be seen from FIG. 3 that the addition of the chemical amplification components substantially increases the sensitivity of the resist, for both of the developers used. In all cases shown above, except for the first exposure of the pure derivative resist film, a post exposure bake of the samples for 240 seconds at 105° C. was applied before development. The sensitivity of MF02-01D is 750 µC/cm² with the developer MCB, and 400 µC/cm² for the MCB:IPA [1:2] developer. It can be seen from FIG. 3 that the addition of the chemical amplification components substantially increases the sensitivity of the resists. MF02-01D[CA] has a sensitivity of 5 µC/cm² with the MCB developer, and with the MCB:IPA [1:2] it was 3 µC/cm².

EXAMPLE 5

Response to Electron Irradiation of MF03-01 and MF03-01[CA]

MF03-01, is a multiple addend derivative of $C_{60}$, somewhat smaller than MF02-01. The compound is again prepared as a mixture of tetra, penta and hexa adduct derivatives. In this case only one ratio of derivatives was investigated.

The sensitivity of pure MF03-01 was found to be ~360 µC/cm², using MCB as the developer. A wide range of derivative, photoacid generator and crosslinker ratios was then investigated. The best results were seen for a film with the proportions 1 mg MF03-01:0.224 mg PAG03-01:1.04 µl CL03-01. A film made with this mixture, exposed to electrons, and treated with a PEB of 100° C. for 60 seconds, before development with MCB was found to have a sensitivity of ~12 µC/cm². The response curve for this film is shown in FIG. 4.

In FIG. 5, the variation of the sensitivity of the MF03-01 [CA] composition with electron beam energy is shown. It can be seen that the sensitivity increases as the energy drops from 20 to 5 keV.

Nineteen samples of MF03-01[CA] were prepared with differing ratios of HMMM and PAG, and exposed to electrons at 20 keV. In each case there was no PAB, and a PEB of 100° C. and 60 seconds was used. The development process was 10 seconds in MCB, followed by an IPA rinse and nitrogen drying. The results showed that PAG on its own does not improve the sensitivity. The best sensitivities are seen when there are between 0.5 and 1 µl of HMMM per mg of MF03-01 and ~0.2 to ~0.4 mg of PAG per mg of MF03-01. Table 1 shows some of the combinations that give the best sensitivities. It can been seen that with the given processing conditions, sensitivities of up to 11.7 µC/cm² can be achieved.

TABLE 1

| MF03-01 (mg) | PAG (mg) | HMMM (µl) | Sensitivity (C/cm²) |
|---|---|---|---|
| 1 | 0.224 | 1.041 | 0.0000117 |
| 1 | 0.224 | 0.798 | 0.0000143 |
| 1 | 0.299 | 1.041 | 0.0000143 |
| 1 | 0.374 | 0.798 | 0.0000154 |
| 1 | 0.374 | 0.555 | 0.0000176 |

Using a composition of 1 mg MF03-01A to 0.209 mg PAG03-01 to 1.036 µl CL03-01, 30 samples were prepared and exposed under the same conditions, and exposed to PEB conditions varying from 30 s to 90 s and from 60° C. to 110° C., before a standard MCB/IPA/$N_2$ development. It was found that increasing the temperature has the main effect, although sensitivity is also slightly increased by increased time at a given temperature. Between temperatures of 90° C. (30 s) and 110° C. (30 s) the sensitivity is in the range 15 to 20 µC/cm². At temperatures of 110° C., with times of 45 s or longer the sensitivity drops to less than 9 µC/cm². However, there is some swelling of the pattern at this point and at times of 60 s or longer the swelling becomes excessive.

EXAMPLE 6

Response to Electron Irradiation of MF03-04 and MF03-04[CA]

MF03-04 is a multiple addend derivative of $C_{60}$ prepared as a mixture of tetra, penta and hexa addend derivatives.

Films of pure MF03-04 and MF03-04[CA] were prepared (thickness 100 nm in both cases). The chemically amplified film incorporated PAG03-01 and CL03-01 in a ratio of 1 mg MF03-04D:0.225 mg PAG03-01:1.39 µl CL03-01. Films were formed on hydrogen terminated silicon substrate by spin coating as described above. Shown in FIG. 6 is a graph of the response to irradiation of a film of the chemically amplified and a non amplified film. It can be seen from FIG. 6 that the incorporation of the chemical amplification components substantially improves the sensitivity of the resist from about 650 µC/cm² to about 7.5 µC/cm². The steepness of the response curves is similar, indicating that the contrast of the amplified resist material is comparable to that of the unamplified resist.

EXAMPLE 7

Response to Electron Irradiation of MF03-04[CA‡] Prepared Using a Different Photoinitiator and Crosslinker to Example 6

MF03-04 is a multiple addend derivative of $C_{60}$ prepared as a mixture of tetra, penta and hexa addend derivatives Films of pure MF03-04 and MF03-04[CA‡] were prepared (thickness 100 nm in both cases). The chemically amplified film incorporated the photoinitiator (PI) Triarylsulfonium hexafluoroantimonate salts (Dow) and the crosslinker (CL) DEN438 (Dow) in a ratio of 1 mg MF03-04:1 mg PI:2 mg CL. Films were formed on hydrogen terminated silicon substrate by spin coating as described above. Shown in FIG. 7 is a graph of the response to irradiation of a film of the chemically amplified film (see FIG. 6 for a non amplified film). It can be seen from FIG. 7 that the incorporation of the chemical amplification components substantially improves the sensitivity of the resist from about 650 μC/cm² to about 8 μC/cm². The steepness of the response curves is similar, indicating that the contrast of the amplified resist material is comparable to that of the unamplified resist.

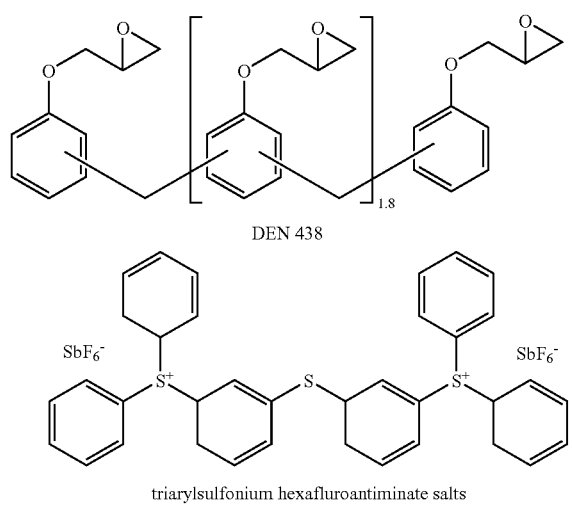

DEN 438 triarylsulfonium hexafluroantiminate salts

Removal of Chemical Amplified Fullerene Resists with Plasma Ashing

It is important to be able to remove the remaining resist pattern after subsequent processing. It has been found that oxygen plasma ashing was more than sufficient to remove the exposed fullerene based films. A Technics PP100E low temperature asher was used to remove the films. The silicon sample bearing the resist pattern was loaded into the plasma asher, and the chamber was evacuated to a pressure of approximately 0.1 Torr. A small flow of oxygen was then allowed to enter the chamber via a needle valve, which was adjusted so that the chamber pressure stabilised at 0.6 Torr. An RF power of 340 W was then used to strike a plasma in the oxygen. The sample was exposed to the oxygen plasma for a period of time and all traces of the exposed resist were easily removed. The duration of the ashing procedure was dependent upon the resist film thickness, but in general, ashing times of five to ten minutes ensured an entirely clean sample.

Etch Durability of Chemical Amplified Fullerene Resists

To test the etch durability of the resists an Oxford Instruments Plasmalab 80+ with Electron Cyclotron Resonance (ECR) attachment was used. ECR etching was used so as to be consistent with results presented in previous papers and patents for the known methanofullerene resists. As plasma etching can be very sensitive to the etching conditions, a control sample of SAL601 resist (Shipley, US) was prepared and etched with all of the fullerene samples so as to ensure that the etch rate was the comparable in each case. The following etching conditions were used for this experiment: RF Power=20 W, DC Self Bias=110V, Microwave Power=250 W, Etching Gas=SF₆, Etching Gas Flow Rate=5 sccm, Chamber Pressure=0.001 Torr, Etch Time=20 minutes. To find the etch durability a square pattern of 100 microns on a side was defined in each of the resist films and the thickness of the film was measured with a surface profiler (height 1). The sample was then etched, and the height of the feature was again measured (height 2). Finally any remaining film was removed using plasma ashing as described above and the height was once again measured (height 3). The etch durability of the material in terms of the etch durability of the silicon substrate is then given by:

height 3/(height 1−(height 2−height 3))

The measured etch durabilities for several of the films and the SAL601 sample are shown in Table 2. As can be seen, the addition of the chemical amplification components to the MF03-04 film does not substantially reduce the etch durability, which remains comparable to that of SAL601.

TABLE 2

| Etch Durability (as a multiple of the durability of silicon) | |
|---|---|
| Compound | Etch Durability |
| SAL601 | 3.7 |
| MF02-01A | 4.0 |
| MF03-01[CA] | 2.4 |
| MF03-04 | 3.7 |
| MF03-04[CA] | 3.1 |

It has previously been demonstrated that certain fullerene derivatives are high resolution, high durability electron beam resists, but they suffer from unsafe processing solvents and low sensitivity. The inventors have expanded the range of useful fullerene resist materials and have demonstrated that by the process of chemical amplification it is possible to substantially increase the sensitivity of fullerene derivative resists (both those already known and those newly proposed), by one to two orders of magnitude, into the industrially useful sub-10 μC/cm² region. It has also been shown that several safe solvents exist for both the casting and the developing processes. It has also been shown that the etch ratio of the chemical amplified formulations is not substantially reduced over that of the pure derivatives. Finally, it has been demonstrated that the resists can be easily removed by oxygen plasma ashing.

The invention claimed is:

1. A method for the formation of a patterned resist layer on a substrate surface, the method comprising the steps of:
   forming a coating layer;
   selectively irradiating said coating layer; and
   developing to selectively dissolve away said irradiated layer,
   wherein the coating layer comprises a methanofullerene derivative having a plurality of open-ended addends, said methanofullerene being represented by the formula $C_{2x}(CR_1R_2)_m$ where x is at least 17, m is at least 2, each addend represented by $CR_1R_2$ is the same or different, and wherein each $R_1$ and $R_2$ is each a monovalent organic group, or a divalent organic group which forms a ring structure by being joined to the fullerene shell, or where both $R_1$ and $R_2$ of an addend are divalent groups, they may be mutually joined to form a ring structure, save that at least two of $R_1$ or two of $R_2$ are monovalent, or a mixture of such derivatives,
   wherein the methanofullerene derivative has one or more addends satisfying the formula:

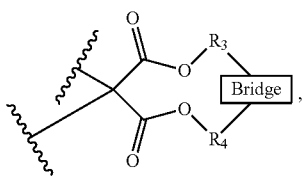

wherein $R_3$ and $R_4$ are independently selected from $-[(CH_2)_nO_q]_p-R_5-$, n is from 1 to 8, p is from 1 to 5, q is 0 or 1, and $R_5$ is selected from the group consisting of straight alkyl, branched alkyl, cycloalkyl, a heterocycle, a substituted aromatic moiety, and an unsubstituted aromatic moiety, and the bridge is $-[O_q(CH_2)_nO_q]_p-$.

2. The method of claim 1, wherein the coating layer comprises a mixture of derivatives, said derivatives differing only in the value of m.

3. The method of claim 1, wherein for each addend, $R_1$ and $R_2$ are the same.

4. The method of claim 1, wherein at least one of $R_1$ and $R_2$ contains a polyether moiety.

5. The method of claim 1, wherein the methanofullerene derivative has the following addend:

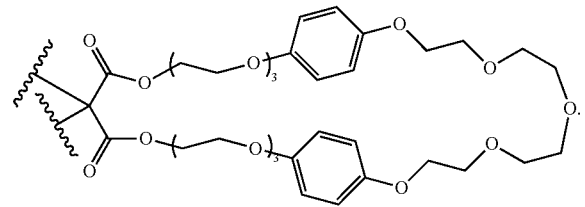

6. A method for the formation of a patterned resist layer on a substrate surface by patternwise irradiation with actinic radiation comprising the steps of:

(i) forming a coating layer comprising a methanofullerene,
(ii) irradiating the coating layer patternwise, and
(iii) removing unirradiated areas of the coating layer,
wherein said methanofullerene is represented by the formula $C_{2x}(CR_1R_2)_m$, where x is at least 17, m is at least 2, each addend represented by $CR_1R_2$ is the same or different, and wherein each $R_1$ and $R_2$ is each a monovalent organic group, or a divalent organic group which forms a ring structure by being joined to the fullerene shell, or where both $R_1$ and $R_2$ of an addend are divalent groups, they may be mutually joined to form a ring structure, save that at least two of $R_1$ or two of $R_2$ are monovalent, or a mixture of such derivatives, and
wherein the methanofullerene is chemically amplified, by including in the coating layer formed in step (i) at least one additional component which increases the sensitivity of the exposed layer to the actinic radiation of step (ii).

7. The method of claim 6 wherein step (i) is achieved by application of the methanofullerene in solution followed by removal of the solvent, the solvent being selected from chloroform, chlorobenzene, dichlorobenzene, anisole, ethyl-3-ethoxy propionate and acetone.

8. The method of claim 6, wherein step (iii) is achieved by selectively dissolving the unirradiated areas of the coating layer in a second solvent, said second solvent being selected from chloroform, chlorobenzene, dichlorobenzene, anisole, ethyl-3-ethoxy propionate, acetone, isopropyl alcohol/water, and chlorobenzene/isopropyl alcohol.

9. The method of claim 8, wherein the solvent used in step (iii) is selected from anisole, 3-ethoxy propionate, isopropyl alcohol/water in a ratio of at least 1:1, and chlorobenzene/isopropyl alcohol, in a ratio of 1:2.

10. The method as claimed in claim 6, wherein the additional components are a photo acid generator and a crosslinker.

11. The method as claimed in claim 10, wherein the photo acid generator is triphenylsulphonium triflate and the cross linker is a hexaalkoxymethylmelamine.

\* \* \* \* \*